United States Patent [19]
Bähr et al.

[11] Patent Number: 5,604,586
[45] Date of Patent: Feb. 18, 1997

[54] COLOR-MATCHING APPARATUS FOR THE VISUAL ON-LIGHT EVALUATION OF FLEXIBLE COPIES

[75] Inventors: Klaus Bähr, Offenbach am Main; Eckhard Köbler, Heidelberg; Tobias Müller, Hirschberg, all of Germany

[73] Assignee: Heidelberger Druckmaschinen AG, Heidelberg, Germany

[21] Appl. No.: 375,965

[22] Filed: Jan. 20, 1995

[30] Foreign Application Priority Data

Jan. 20, 1994 [DE] Germany ............................ 44 01 534.8

[51] Int. Cl.⁶ ............................ G01N 21/01; A47F 5/16; G09F 13/04
[52] U.S. Cl. ............................ 356/244; 108/23; 362/33; 362/94
[58] Field of Search ............................ 356/244, 238, 356/402, 425, 443, 444, 380; 362/33, 97; 108/23; 101/127.1, 211; 355/113

[56] References Cited

U.S. PATENT DOCUMENTS

| | | | |
|---|---|---|---|
| 1,984,898 | 12/1934 | Schamback et al. | 356/443 |
| 2,101,710 | 12/1937 | Huber | 354/443 |
| 4,173,034 | 10/1979 | Shemitz | 362/98 |
| 4,668,090 | 5/1987 | Kipphan et al. | 356/244 |
| 5,115,380 | 5/1992 | Huisingh et al. | 362/33 |

FOREIGN PATENT DOCUMENTS

| | | |
|---|---|---|
| 3216991 | 8/1984 | Germany . |
| 5-3954 | 1/1993 | Japan . |
| 781598 | 8/1957 | United Kingdom . |

OTHER PUBLICATIONS

Publication: Deutsche Drucker (German Printer) No. 38/26, No. 11, p. XIX:.

Primary Examiner—Hoa Q. Pham
Attorney, Agent, or Firm—Herbert L. Lerner; Laurence A. Greenberg

[57] ABSTRACT

A color-matching apparatus for visual on-light evaluation of flexible copies includes a support for at least one copy having a supporting surface being concave as viewed by an observer. An areally radiating illumination configuration emits light of a defined type onto copies and generates a defined intensity of illumination in the supporting surface. The illumination configuration has a radiating surface being substantially convex, as viewed by the observer.

9 Claims, 2 Drawing Sheets

COLOR-MATCHING APPARATUS FOR THE VISUAL ON-LIGHT EVALUATION OF FLEXIBLE COPIES

BACKGROUND OF THE INVENTION

Field of the Invention

The invention relates to a color-matching apparatus for the visual on-light evaluation of flexible copies, particularly for the color matching of multi-color prints.

Color-matching configurations are used in the printing industry for assessing the quality of prints. In such color-matching configurations, a printed product is brought onto a desk-like color-matching table and is compared under defined illumination and observation conditions with a reference copy. In order to prevent errors in color matching, precautions are taken on the color-matching configuration to keep extraneous, interfering light away from the color-matching surface and to prevent the eye of the observer from being disturbed by reflections or other brightness emanating from the illumination source.

Due to the predominantly expected glossy properties of the stocks, color matching should be carried out under illumination at 0° and observation at 45°. In order to obtain a glare-free and reflection-free color-matching surface for printed sheets by using simple and cost-saving means, it is known for the surface of the sheet support facing the observer to be angled by means of a wedge-shaped top part, as in German Patent DE 32 16 991 C2, corresponding to U.S. Pat. No. 4,668,090.

A disadvantage thereof is the fact that the color-matching surface is thus discontinuous, with the result that there is only freedom from glare and reflection in some regions.

In the German periodical entitled: Deutscher Drucker [German Printer] No. 38/26, No. 11, page XIX, a color-matching cabin is shown that is supposed to reduce reflection and glare for the observer, as a result of a concave form of the supporting surface for a printed product. The cabin is encapsulated against extraneous light both at the sides and above the supporting surface. That structure can still be expected to exhibit disturbing glare effects originating from the illumination source inside the cabin.

In the structure disclosed in U.S. Pat. No. 4,173,034, undesired reflections in certain places are prevented by means of displaceable and rotatable diaphragms that are disposed in front of the light source. A disadvantage thereof is the fact that only some regions of the color-matching surface are covered by that structure.

In a control desk for printing presses, it is known for the reference copy to be positioned vertically, with the copy being attached on a support, with the support being adapted to be moved towards and away from an observer, and with the copy also being vertically adjustable. A disadvantage thereof is the fact that it is not possible, for all positions of the copy, to comply with the aforementioned illumination and observation angles, as in Published Japanese Application No. 5-3954.

SUMMARY OF THE INVENTION

It is accordingly an object of the invention to provide a color-matching apparatus for the visual on-light evaluation of flexible copies, which overcomes the hereinafore-mentioned disadvantages of the heretofore-known devices of this general type, which reduces the interference of light on a color-matching surface and extensively prevents extraneous light that emanates from an illumination source and falls directly onto the eye of an observer.

With the foregoing and other objects in view there is provided, in accordance with the invention, a color-matching apparatus for visual on-light evaluation of flexible copies, comprising a support for at least one copy having a supporting surface being concave as viewed by an observer; and an areally radiating illumination configuration emitting light of a defined type onto copies and generating a defined intensity of illumination in the supporting surface, the illumination configuration having a radiating surface being substantially convex, as viewed by the observer.

The effect of the convex illumination configuration is that the light beams which strike a copy are scattered in such a manner that there are no disturbing reflections.

In accordance with another feature of the invention, the radiating surface of the illumination configuration and the supporting surface for the copies are cylindrical in form with identical curvature and with evolutes being coincident.

In accordance with a further feature of the invention, in order to adapt the color-matching apparatus to the ergonomics of the observer, the illumination configuration and/or the support for the copies are adjustable in relation to one another, resulting in an optimal observation angle.

In accordance with an added feature of the invention, the illumination configuration is swivelable about an axis, and the support is adapted to be moved towards and away from the observer.

In accordance with an additional feature of the invention, the support is horizontally displaceable.

In accordance with yet another feature of the invention, the illumination configuration contains a plurality of curved neon tubes, and neon tubes which are situated at the edge are less spaced apart than centrally situated neon tubes. This makes it possible to improve the uniformity of illumination.

In accordance with yet a further feature of the invention, the neon tubes are curved.

In accordance with a concomitant feature of the invention, in order to reduce glare for the observer, the neon tubes are disposed parallel in a straight viewing direction of the observer.

Other features which are considered as characteristic for the invention are set forth in the appended claims.

Although the invention is illustrated and described herein as embodied in a color-matching apparatus for the visual on-light evaluation of flexible copies, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
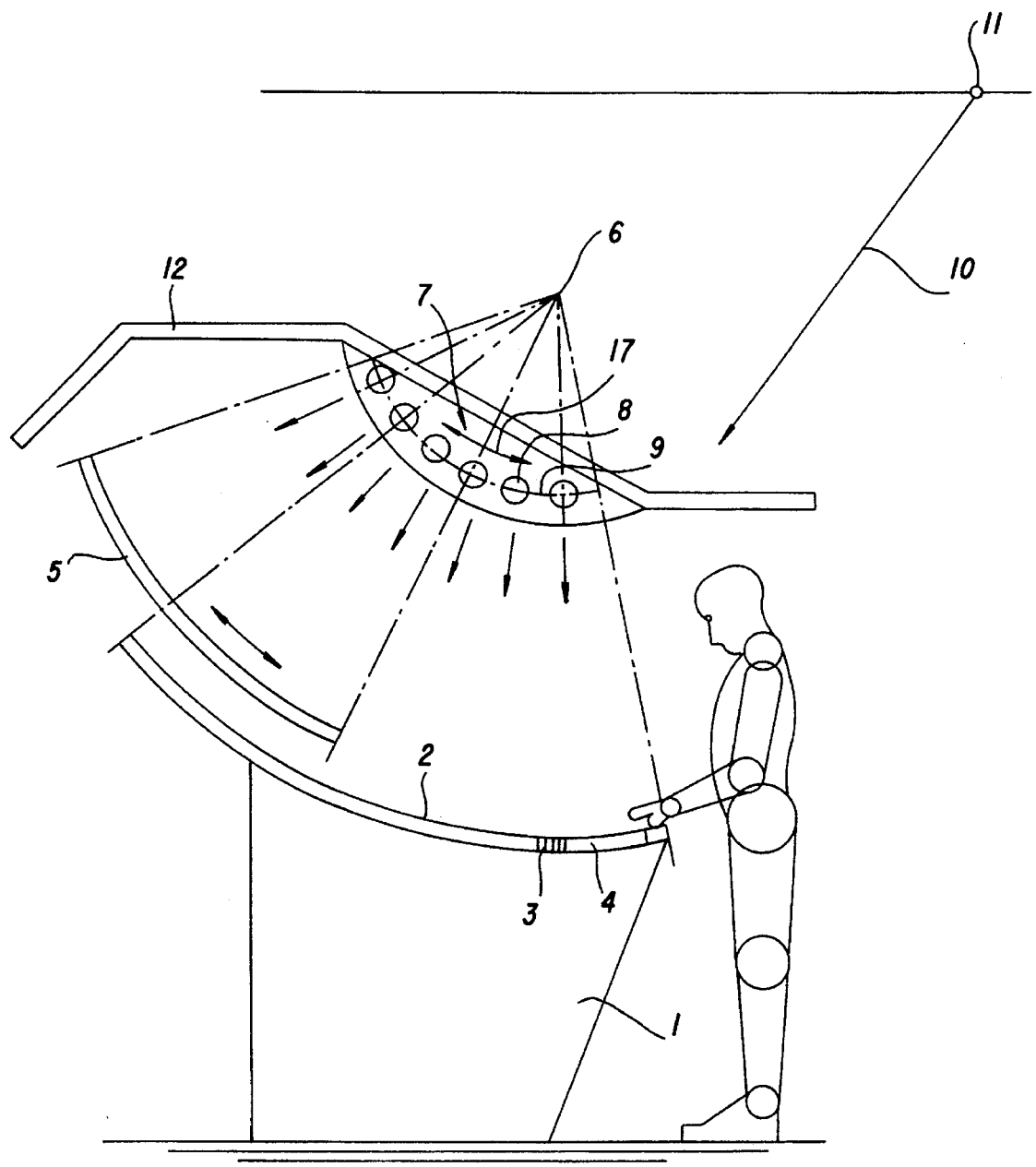
FIG. 1 is a diagrammatic, side-elevational view of a color-matching apparatus according to the invention.

Referring now to the figures of the drawing in detail and first, particularly, to FIG. 1 thereof, there is seen a color-matching apparatus which is formed of a desk 1 with a concavely curved plate 2. The plate 2 firstly serves as a support for a copy that is to be color-matched and secondly may contain control elements 3 and displays 4 for the control of a printing press. Surfaces of the displays 4 may likewise be concave, resulting in good readability. Additionally provided is a sample-sheet holder 5, which is swivelably held about a common evolute 6 of the surfaces of the plate 2 and of the supporting surface of the sample-sheet holder 5. The sample-sheet holder 5 serves to accommodate reference copies for comparison with the copy that is to be matched. Disposed above the plate 2 and the sample-sheet holder 5 is an illumination configuration 7 with neon tubes 8. The neon tubes 8 have illuminated surfaces which lie in a (as viewed by the observer) convex plane 9. The convex plane 9, like the supporting surfaces on the plate 2 and on the sample-sheet holder 5, is cylindrical in form, and the evolute thereof is coincident with the evolute 6. A multi-element cover or roof 12 is provided in order to cut off extraneous light 10 from a ceiling-mounted illumination configuration 11. The illumination configuration (arrow 17) and the supporting surface (arrow 18) are adjustable in relation to an observation angle of the observer.

Figure 2:
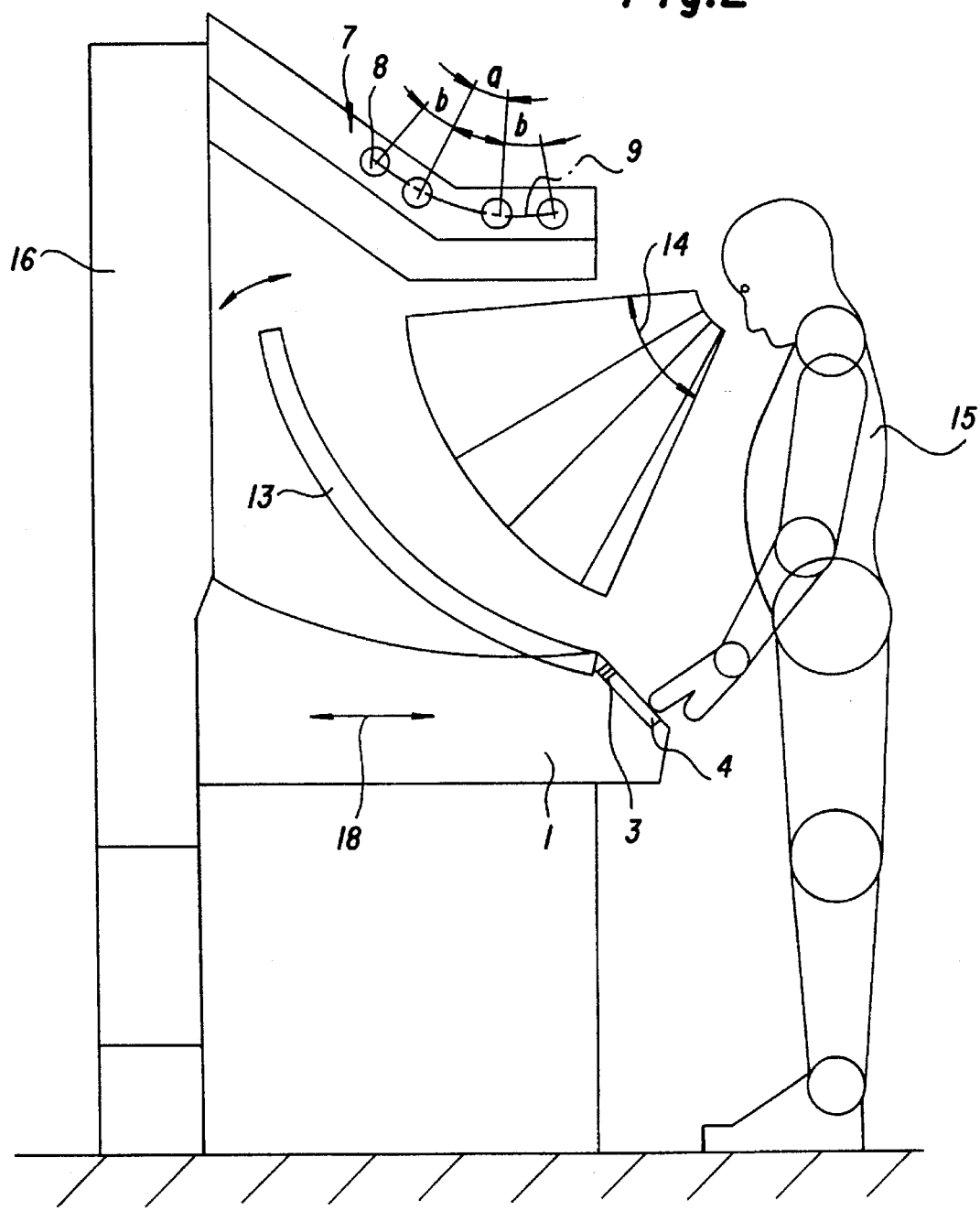
FIG. 2 is a view similar to FIG. 1 of an apparatus with a swivelable support.

Provided in FIG. 2 is a swivelable support 13 for copies, the inclination of which is adaptable to an observation angle 14 of an observer 15. The illumination configuration 7 is attached to a frame 16. A distance b between the outer neon tubes 8 is smaller than a distance a between the more centrally situated neon tubes 8. This makes it possible to improve the uniformity of the illumination.

We claim:

1. A color-matching apparatus for visual on-light evaluation of flexible copies, comprising:

a color-matching support for at least one flexible printed copy having a supporting surface being concave as viewed by an observer; and an illumination configuration emitting light onto copies and generating a defined intensity of illumination in said supporting surface, said illumination configuration having a radiating surface being substantially convex, as viewed by the observer;

said color-matching support and said illumination configuration being disposed so as to allow visual inspection of the at least one printed copy by the observer.

2. The color-matching apparatus according to claim 1, wherein said radiating surface and said supporting surface have the same curvature.

3. The color-matching apparatus according to claim 2, wherein said radiating surface and said supporting surface are cylindrical.

4. The color-matching apparatus according to claim 3, wherein said radiating surface and said supporting surface have coincident evolutes.

5. The color-matching apparatus according to claim 1, wherein said illumination configuration and said supporting surface are adjustable in relation to an observation angle of the observer.

6. The color-matching apparatus according to claim 5, wherein said illumination configuration is swivelable about an axis, and said supporting surface is movable towards and away from the observer.

7. The color-matching apparatus according to claim 6, wherein said supporting surface is horizontally displaceable.

8. The color-matching apparatus according to claim 1, wherein said illumination configuration contains a plurality of neon tubes.

9. The color-matching apparatus according to claim 8, wherein said illumination configuration has an edge and a center, and said neon tubes disposed at said edge are spaced apart by a smaller distance than said neon tubes disposed at said center.

\* \* \* \* \*